(12) United States Patent
Mizoguchi

(10) Patent No.: US 6,178,309 B1
(45) Date of Patent: *Jan. 23, 2001

(54) ELECTRONIC DEVICE HAVING AN AGC LOOP

(75) Inventor: Tamiyuki Mizoguchi, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/931,829

(22) Filed: Sep. 16, 1997

(30) Foreign Application Priority Data

Sep. 17, 1996 (JP) ..................................................... 8-245074

(51) Int. Cl.$^7$ ..................................................... H04B 1/00
(52) U.S. Cl. .......................................... 455/67.1; 455/127
(58) Field of Search ..................................... 455/423, 425, 455/67.1, 115, 38.3, 574, 127, 343, 572, 333

(56) References Cited

U.S. PATENT DOCUMENTS

| | | | |
|---|---|---|---|
| 4,521,912 | 6/1985 | Franke et al. ......................... | 455/115 |
| 5,126,688 | * 6/1992 | Nakanishi et al. ..................... | 330/285 |
| 5,175,875 | * 12/1992 | Yokoya et al. ........................ | 455/127 |
| 5,551,067 | * 8/1996 | Hulkko et al. ......................... | 455/88 |
| 5,663,692 | * 9/1997 | Swope .................................. | 333/101 |
| 5,828,953 | * 10/1998 | Kawase ............................... | 455/127 |

FOREIGN PATENT DOCUMENTS

| | | |
|---|---|---|
| 60-261228 | 12/1985 | (JP) . |
| 4-200140 | 7/1992 | (JP) . |
| 4-372227 | 12/1992 | (JP) . |
| 8-8769 | 1/1996 | (JP) . |
| 8-265210 | 10/1996 | (JP) . |
| 10-22757 | 1/1998 | (JP) . |

* cited by examiner

Primary Examiner—Reinhard J. Eisenzopf
Assistant Examiner—Makoto Aoki
(74) Attorney, Agent, or Firm—Sughrue, Mion, Zinn, Macpeak & Seas, PLLC

(57) ABSTRACT

In a radio device, a switch 2 is disposed between a power amplifier 1 and an antenna 3, and during production of the radio device, the switch 2 is connected to a power meter 14. A battery voltage or a detection voltage corresponding to a predetermined transmission power is measured, and then stored as a comparison voltage in a memory 9. In use, the battery voltage or the detection voltage is compared with the comparison voltage, and upon detection of a low voltage, this fact is announced from a speaker 11 to a user.

6 Claims, 3 Drawing Sheets

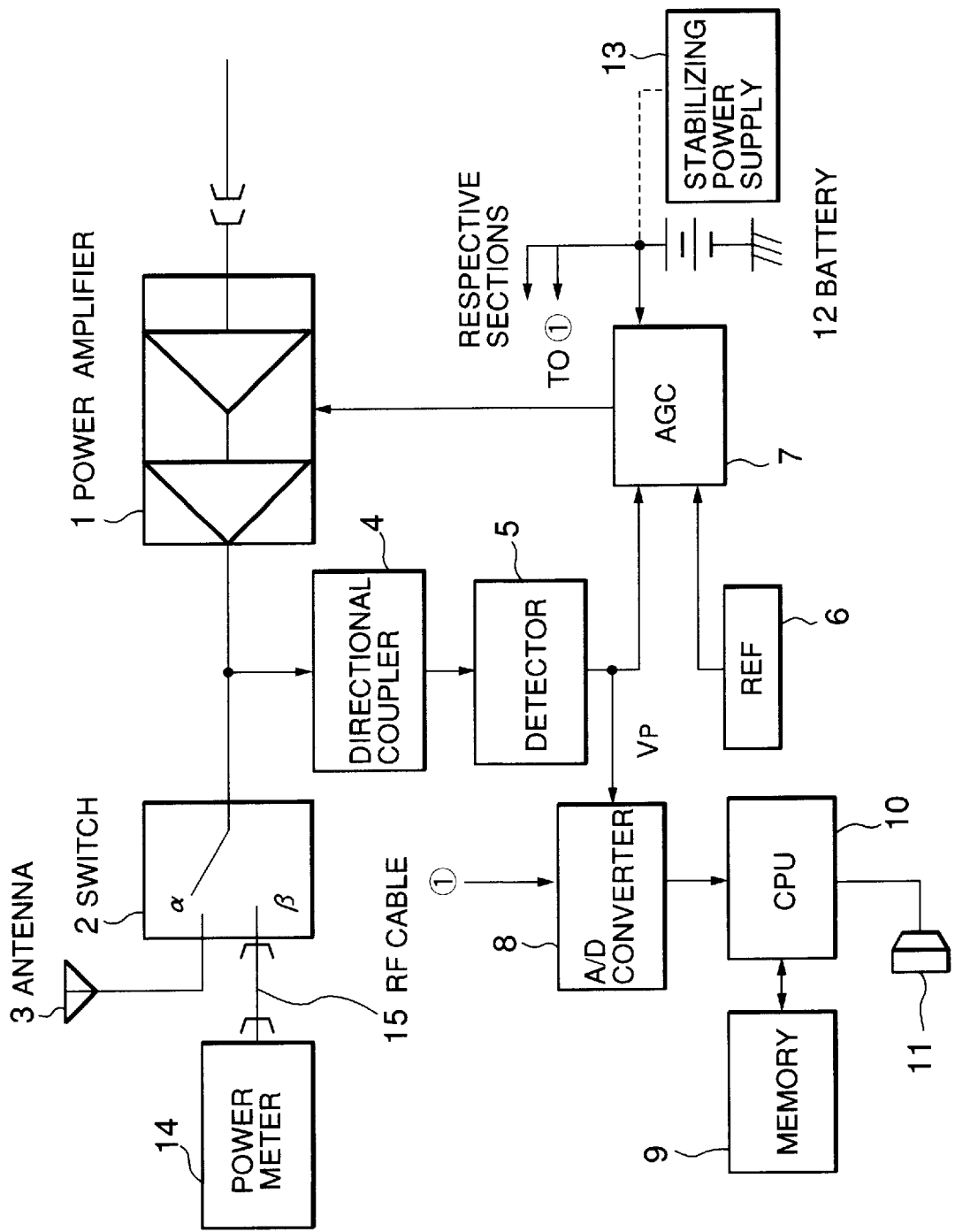

ELECTRONIC DEVICE HAVING AN AGC LOOP

BACKGROUND OF THE INVENTION

1. Field of the Invention

The present invention relates to an electronic device having an AGC loop, and more particularly to a portable radio device which compensates errors caused by accuracy in manufacturing electronic parts, etc.

2. Description of the Related Art

Up to now, in a portable radio device such as a cordless telephone, etc., the respective circuits in the device are driven by a battery. For that reason, when a porter (user) uses the portable radio device for a long period, a battery voltage drops, thereby coming to an unusable state.

To eliminate the above defect, a technique in which upon detection of the battery voltage that drops lower than a predetermined voltage, the fact that the voltage has dropped is announced to the user, has been disclosed in, for example, Japanese Patent Unexamined Publication No. Hei 4-200140.

According to the disclosure in the publication, there are provided a primary battery and an auxiliary battery, and when a voltage of the primary battery drops, the battery in use is switched from the primary battery to the auxiliary battery while the fact that the voltage has dropped is announced to the user.

However, in the above conventional portable radio device, a predetermined voltage is compared with an output voltage of the battery, and when the output voltage of the battery is lower than the predetermined voltage, an alarm is given to the user. Under this circumstance, for example, if a transmission power depending on the characteristic of a power amplifier is different between the respective devices, that is, if the transmission power relative to the voltage is different between the respective devices, the following problems occur because the same predetermined voltage is set in all the radio devices. There occurs such a disadvantage that in a radio device, the user is alarmed although the device is still in a communicatable state, and in another radio device, the user is not alarmed even though the communication quality is poor.

Also, when the battery in use is switched from the primary battery to the auxiliary battery, the communication quality is improved in a short period. However, the provision of the auxiliary battery makes it difficult to downsize the device.

SUMMARY OF THE INVENTION

The present invention has been made to solve the above problems, and therefore an object of the present invention is to provide a portable radio device which is capable of setting a voltage which is compared with an output voltage of a battery, individually.

Another object of the present invention is to provide a portable radio device which improves in reliability such as the transmission efficiency, the uniformity of the communication quality, etc.

Still another object of the present invention is to provide a portable radio device which is capable of being downsized while improving in reliability such as the transmission efficiency, the uniformity of the communication quality, etc.

In order to achieve the above objects, according to the present invention, there is provided a portable radio device which includes a power amplifier for amplifying a radio frequency signal, an antenna for sending the radio frequency signal, a switch connected between the power amplifier and the antenna, a gain controller for controlling the radio frequency signal which is sent from the antenna to a predetermined power, a converter for converting a transmission power value of the power amplifier into a voltage corresponding to the transmission voltage value, a memory in which a predetermined comparison voltage is stored, and a comparator for comparing the voltage with the comparison voltage.

It is preferable that the switch is a three-point switch having a movable contact which is connected to one of a first contact which is connected to the antenna and a second contact which sets the comparison voltage.

It is preferable that the converter includes a directional coupler for taking out a given power according to the transmission power value, and a detector for detecting said voltage according to the power from the directional coupler.

Also, according to the present invention, there is provided a portable radio device which includes a converter for converting a transmission power from a power amplifier into a d.c. voltage, a memory for storing a supply voltage obtained when the transmission power becomes a predetermined power as a comparison voltage, and a circuit for comparing the d.c. voltage with the comparison voltage to generate an alarm when the d.c. voltage is lower than the comparison voltage.

Further, according to the present invention, there is provided a portable radio device which includes a power amplifier for amplifying a radio frequency signal, an antenna for sending said radio frequency signal, a switch connected between the power amplifier and the antenna, a gain controller for controlling the radio frequency signal which is sent from the antenna to a predetermined power, a memory in which a predetermined voltage is stored, and a comparator for comparing a supply voltage with the voltage.

It is preferable that the portable radio device further includes a notification circuit for announcing the drop of the supply voltage to a user when the comparator judges that the supply voltage is lower than the voltage.

With the above structure of the present invention, the difference of a timing when the user is notified to the voltage drop between the respective devices can be eliminated.

BRIEF DESCRIPTION OF THE DRAWINGS

These and other objects, features and advantages of this invention will become more fully apparent from the following detailed description taken with the accompanying drawings in which:

FIG. 3 is a structural block diagram showing a portable radio device according to another embodiment of the present invention.

In the drawings, the same reference numerals denote the same structural elements.

DETAILED DESCRIPTION OF THE PREFERRED EMBODIMENTS

Now, a description will be given in more detail of preferred embodiments of the present invention with reference to the accompanying drawings.

Figure 1:
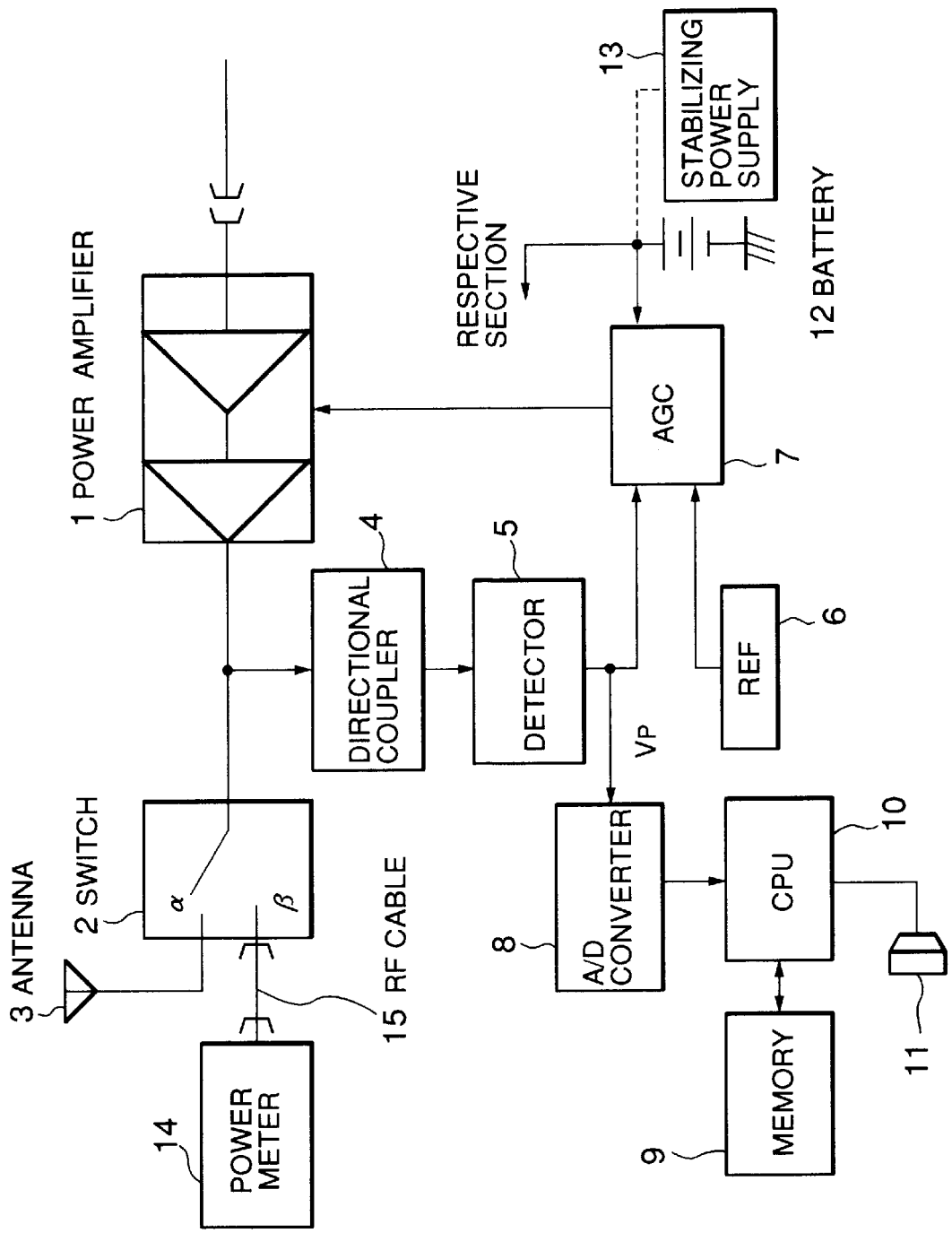
FIG. 1 is a structural block diagram showing a portable radio device according to an embodiment of the present invention.

FIG. 1 is a structural block diagram showing a transmission section of a portable radio device according to an embodiment of the present invention.

In FIG. 1, a power amplifier 1 power-amplifies a radio frequency signal. An antenna 3 sends the power-amplified radio frequency signal through a switch 2. The antenna 3 is connected to a movable contact a of the switch 2. The switch 2 is preferably made up of a three-point switch a movable contact of which is connected to any one of contacts α or β.

A directional coupler 4 branches a part of the power-amplified radio frequency signal and takes out it. A d.c. detector 5 detects the taken-out radio frequency signal to obtain a d.c. voltage Vp. A reference voltage generator (REF) 6 generates a reference voltage, preferably, a reference voltage of 1.0V. A transmission power automatic gain control circuit (AGC) 7 compares the reference voltage with the d.c. voltage from the d.c. detector 5 to control the power amplifier 1 such that a difference between the reference voltage and the d.c. voltage becomes 0 (zero). Through an AGC loop which is made up of the directional coupler 4, the detector 5 and the AGC 7, the power amplifier 1 obtains a given output power which is preferably 30 dBm. For example, when the transmission power is 30 dBm, the d.c. detector 5 obtains the d.c. voltage of 1V. In addition, the directional coupler 4 supplies to the d.c. detector 5 a power which is coupled so as not to affect the transmission power of the directional coupler 4.

An analog-to-digital (A/D) convertor 8 converts a d.c. voltage Vd from the detector 5 into a digital value, and the digital value is compared with a set voltage Vdth stored in a memory 9 in advance through a CPU 10. The CPU 10 allows a speaker 11 to be driven when the digital value is lower than the set voltage Vdth to alarm a user. The set voltage Vth stored in the memory 9 is set individually during production of the radio device as will be described later.

A battery 12 supplies a power to the respective circuits including the AGC 7.

A stabilizing power supply 13 is used instead of the battery 12 during production of the radio device, and therefore is not provided in the radio device when the device is forwarded from a factory. A power meter 14 is used in a state where it is connected to the contact β of the switch 2 through the movable contact and an RF cable 15 during production of the radio device, and therefore is not provided in the radio device when the radio device is forwarded from the factory. Also, the movable contact of the switch 2 is connected to the contact β thereof during production of the radio device, but it is connected to the contact α when the device is forwarded from the factory.

Subsequently, the operation of the portable radio device according to the present invention will be described.

During production of the radio device, the power meter 14 is connected to the contact β of the switch 2 through the RF cable 15, and the movable contact of the switch 2 is connected to the contact α thereof. Instead of the battery 12, the stabilizing power supply 13 supplies the power to the respective circuits.

The radio frequency signal is amplified to a predetermined output power, preferably 30 dBm through the power amplifier 1. A part of the output voltage from the power amplifier 1 is converted into a voltage Vd corresponding to the power through the directional coupler 4 and the detector 5, and the power amplifier 1 is controlled by the AGC 7 in such a manner that the output power is kept constant. The voltage Vd is converted into the digital value through the A/D convertor 8 and then supplied to the CPU 10.

The output power from the power amplifier 1 is supplied to the power meter 14 through the contact β of the switch 2, so as to be power-monitored. The voltage from the stabilizing power supply is changed to a predetermined power Pth with which the voltage drop is to be announced to the user. The voltage drop preferably represents the condition under which the device is inoperable. A voltage Vp from the detector 5 when the power Pth is detected by the power meter 14 is stored in the memory 9 as the comparison voltage Vdth through the CPU 10.

With the above operation, the voltage corresponding to the given power is obtained for each of the radio devices, and then stored as the comparison voltage.

When the production of the radio device is completed, and the radio device is forwarded from a factory, the power meter 14, the RF cable 15 and the stabilizing power supply 13 are removed from the radio device, and the movable contact of the switch 2 is connected to the contact α thereof.

In an actual use, the radio frequency signal is amplified by the power amplifier 1, and then sent out from the antenna 3 through the switch 2. On the other hand, a part of the amplified radio frequency signal is converted through the directional coupler 4 and the detector 5 into a d.c. voltage which is controlled so as to be made the given power by the AGC 7. Also, the output voltage Vd from the detector 5 is converted into a digital value through the A/D convertor 8, and then compared with the set voltage or comparison voltage Vdth as stored in advance in the CPU 10. When the detected voltage Vd is lower than the set voltage Vdth, the speaker 11 is driven.

Figure 2:
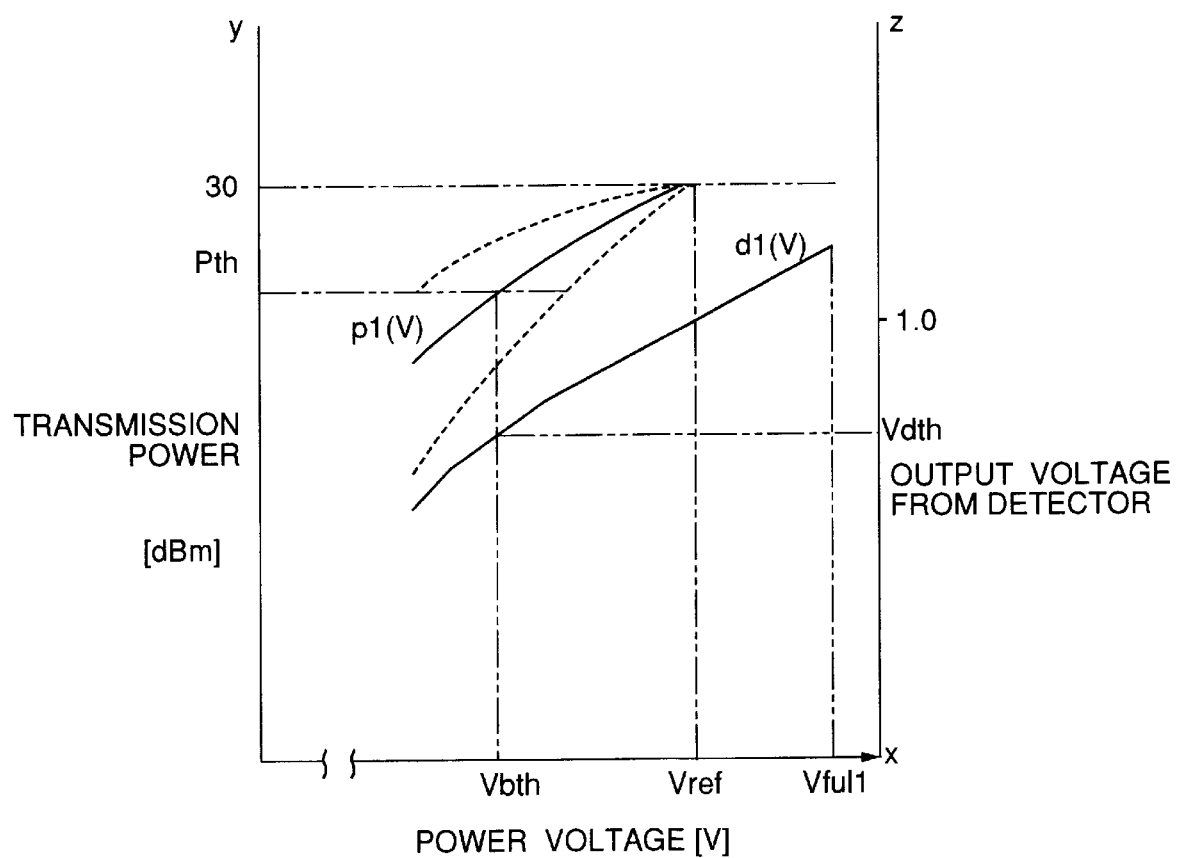
FIG. 2 is a graph representative of a relation between a transmission power and a supply voltage of the portable radio device shown in FIG. 1.

FIG. 2 is a graph for explaining a relation between the supply voltage and the transmission power. In FIG. 2, the axis of abscissas represents the supply voltage whereas the axis of ordinates on the left side represents the transmission power, and the axis of ordinates on the right side represents the output voltage of the detector.

The power amplifier 1, in which a power is supplied from the battery 12, is controlled so as to obtain a constant output power, for example, 30 dBm by the control of the AGC 7. There arises no problem if the AGC 7 and the power amplifier 1 are in a charged state (voltage Vref to Vfull) which is sufficient to fully charge the battery 12 or to drive the output of 30 dBm. However, when the voltage becomes lower than the voltage Vref which is sufficient to send the power of 30 dBm due to the discharge of the battery 12, the transmission power Pv is also monotonously reduced with the voltage drop of the battery 12. The way of reduction of the transmission power Pv is different depending on the individual power amplifiers as indicated by dotted lines, and in case of this embodiment, it is indicated by a solid line P1 (v).

The comparison voltage Vth which has been measured during the production is stored in the memory 9, and corresponds to the power Pth with which an alarm is given.

In FIG. 2, a solid line d (v) represents the output power voltage of the detector.

Then, a portable radio device according to another embodiment of the present invention will be described with reference to FIG. 3. In FIG. 3, the same reference numerals or symbols as those in FIG. 1 have the identical meanings. For prevention of lengthy explanation, only portions different from those in FIG. 1 will be described.

In FIG. 3, a voltage from the battery 12 or the stabilizing power supply is supplied to the A/D convertor 8, and the voltage Vbth from the stabilizing power supply when the power Pth which has been measured by the power meter 14 during the production is stored in the memory 9, and in actual use, the voltage from the battery 12 is compared with the voltage Vbth as stored.

In the above-mentioned embodiments, the portable radio device was described as an example, but the present invention is applicable to communication devices, receivers or electronic devices with the power amplifier without being limited by or to those embodiments.

As was described above, according to the present invention, the optimum output of the detector and the optimum set voltage such as the battery voltage, etc., with respect to the given transmission power are stored in the memory in each of the radio devices, and the user is alarmed using the optimum set voltage as stored. With this structure, a difference in the individual transmission power between the respective portable radio devices is eliminated, thereby being capable of unifying the communication quality and improving the reliability.

While the invention has been described with reference to specific embodiments thereof, it will be appreciated by those skilled in the art that numerous variations, modifications, and embodiments are possible, and accordingly, all such variations, modifications, and embodiments are to be regarded as being with in the spirit and scope of the invention.

What is claimed is:

1. A method for setting a threshold voltage in an electronic device having a power amplifier for amplifying a signal, an automatic gain controller for controlling an output power from the power amplifier so that the output power becomes a predetermined first power, said automatic gain controller configured to receive voltage from an stabilizing power supply, a detector for detecting the output power from the power amplifier, a memory for storing a predetermined voltage indicative of the output power detected by the detector when the output power is essentially equal to a predetermined second power which is smaller than the predetermined first power, a comparator for comparing a detected voltage, indicative of the output power detected by the detector, with the predetermined voltage stored in the memory, a battery for supplying power to the automatic gain controller, and a connector for connecting a stabilizing power supply to the automatic gain controller, the method comprising:

connecting the stabilizing power supply to the automatic gain controller;
   supplying a voltage from the stabilizing power supply to the automatic gain controller through the connector without supplying power to the automatic gain controller from the battery;
   detecting an output power from the power amplifier while the stabilizing power supply supplies the voltage to the automatic gain controller;
   changing the voltage supplied from the stabilizing power supply until the detected output power is less than or equal to the predetermined second power;
   determining a detected voltage indicative of the detected output power when the detected output power is essentially equal to the predetermined second power; and
   storing the determined detected voltage in the memory as the predetermined voltage, whereby the stored predetermined voltage is the threshold voltage and is based on individual power requirements of the electronic device.

2. The method as claimed in claim 1, wherein said electronic device further comprises a switch having a first contact which is connected to the antenna when the signal is sent, a second contact which is used when the predetermined voltage is stored in the memory, and a movable contact which is connected to one of said first contact and said second contact, and wherein the power meter is connected to the second contact, the method further comprising moving the movable contact to connect the movable contact to the second contact prior to the detecting.

3. A method for notifying a user of an electronic device that a transmission power is lower than a predetermine level, comprising:

connecting a stabilizing power supply to an automatic gain controller;
   supplying a first voltage from the stabilizing power supply to the automatic gain controller;
   detecting a first transmission power while changing the first voltage from the stabilizing power supply to the automatic gain controller;
   storing a second voltage indicative of a detected first transmission power as a predetermined voltage when the detected first transmission power is essentially equal to a threshold power;
   disconnecting the stabilizing power supply;
   supplying a third voltage from a battery to the automatic gain controller;
   detecting a forth voltage indicative of a second transmission power when the battery supplies the third voltage to the automatic gain controller;
   comparing the predetermined voltage with the detected forth voltage indicative of the second transmission power; and
   announcing when the detected forth voltage is lower than the predetermined voltage.

4. The method as claimed in claim 3, further comprising:
   connecting a power meter to detect the first transmission power; and
   disconnecting the power meter after the predetermined voltage is stored.

5. A method for notifying a user of an electronic device that a transmission power is lower than a predetermine level, comprising:

connecting a stabilizing power supply to an automatic gain controller;
   supplying a first voltage from the stabilizing power supply to the automatic gain controller;
   detecting a first transmission power while changing the first voltage from the stabilizing power supply to the automatic gain controller;
   storing a second voltage supplied from the stabilizing power supply as a predetermined voltage wherein the detected first transmission power is essentially equal to a threshold power;
   disconnecting the stabilizing power supply;
   supplying a battery voltage from a battery to the automatic gain controller;
   detecting the battery voltage supplied from the battery to the automatic gain controller;
   comparing the predetermined voltage with the detected battery voltage supplied from the battery; and
   announcing when the detected battery voltage is lower than the predetermined voltage.

6. The method as claimed in claims 5, further comprising:
   connecting a power meter to detect the first transmission power; and
   disconnecting the power meter after the predetermined voltage is stored.

* * * * *

UNITED STATES PATENT AND TRADEMARK OFFICE
CERTIFICATE OF CORRECTION

PATENT NO. : 6,178,309 B1
DATED : January 23, 2001
INVENTOR(S) : Tamiyuki Mizoguchi Page 1 of 1

It is certified that error appears in the above-identified patent and that said Letters Patent is hereby corrected as shown below:

<u>Column 4,</u>
Line 56, delete "d (v)" insert -- d1 (v) --

Signed and Sealed this

Twenty-seventh Day of November, 2001

Attest:

NICHOLAS P. GODICI
Attesting Officer    Acting Director of the United States Patent and Trademark Office